United States Patent [19]

Camplan et al.

[11] 4,254,340
[45] Mar. 3, 1981

[54] HIGH CURRENT ION IMPLANTER

[75] Inventors: Jean Camplan, Paris; Jacques Chaumont, Fontenay-le-Fleury; Robert Meunier, Bonnelles, all of France

[73] Assignee: Agence Nationale de Valorisation de la Recherche (ANVAR), Neuilly sur Seine, France

[21] Appl. No.: 1,691

[22] Filed: Jan. 8, 1979

Related U.S. Application Data

[63] Continuation-in-part of Ser. No. 886,752, Mar. 15, 1978, abandoned.

[30] Foreign Application Priority Data

Dec. 23, 1977 [FR] France .............................. 77 39059

[51] Int. Cl.³ ............................................ H01J 37/00
[52] U.S. Cl. ................................. 250/492 A; 250/398
[58] Field of Search .......... 250/492 A, 492 B, 492 R, 250/396 R, 396 ML, 398; 313/359, 361

[56] References Cited

U.S. PATENT DOCUMENTS

| 3,202,817 | 8/1965 | Belbeoch ...................... 250/396 MZ |
| 3,997,846 | 12/1976 | Coultas et al. ...................... 328/229 |
| 4,013,891 | 3/1977 | Ko et al. .......................... 250/492 A |
| 4,035,655 | 7/1977 | Guermet et al. ................ 250/492 A |
| 4,063,098 | 12/1977 | Enge ................................. 250/396 R |
| 4,075,488 | 12/1978 | Okayama et al. .............. 250/492 A |
| 4,155,011 | 5/1979 | Märk ................................. 250/492 A |

Primary Examiner—Bruce C. Anderson
Attorney, Agent, or Firm—Frishauf, Holtz, Goodman & Woodward

[57] ABSTRACT

High current ion implanter of the type comprising, in a vacuum enclosure, an ion source, means for extracting these ions, scanning means and a sample-carrying target, wherein the scanning means are of the electrostatic type and comprise deflecting plates connected to a sawtooth-variable voltage source and wherein a regulatable magnetic refocussing means are disposed in the vicinity of said plates.

A particular application of the invention is to the construction of ion implanters intended for use in the manufacture of semiconductors.

11 Claims, 3 Drawing Figures

HIGH CURRENT ION IMPLANTER

This is a continuation-in-part of our prior application, Ser. No. 886,752, filed Mar. 15, 1978 abandoned.

BACKGROUND OF THE INVENTION

The present invention relates to a high current ion implanter. A particular application of the invention is in the production of ion implanters used more particularly in the manufacture of semiconductors.

It is known that in the field of material doping ion implantation offers numerous advantages compared with diffusion and epitaxy methods. It essentially comprises producing ions of groups III or V of the periodic system and directing them at the material to be treated. However, this method only gives good results if it proves possible to overcome the difficulty of obtaining a uniform implantation. Thus, in general ion implanters comprise means which make it possible to obtain this uniformity. They vary according to whether the implanter belongs to the category of medium or low current equipment or to the category of high current equipment. The boundary between these two categories depends on the mass and energy of the ions but is generally about 0.5 mA.

In the case of low current implanters two different scanning means makes it possible to obtain the desired uniformity. The first generally comprises two sets of plates to which are applied voltages which vary in sawtooth manner with a frequency of about 1 kHz. The plates of one set are perpendicular to the plates of the other set so that the ion beam can be deflected in two perpendicular directions. Thus, it comprises XY electrostatic scanning. The second means utilizes hybrid electrostatic-mechanical scanning, whereby the implantation surface is moved regularly and perpendicularly to the direction of electrostatic scanning.

To said two scanning means used in low or medium current implanters is often added an accelerating tube which serves to obtain a high ion energy. This tube can be associated with an electron suppressor located downstream and which prevents acceleration of secondary electrons through the accelerating tube and consequently limits the production of X-rays. It is also possible to have ion analyzing means which are able to select the desired ions. Said implanters can also comprise electrostatic refocussing means as well as beam deflecting means which serve to eliminate neutrals. Finally it can be provided with an electron beam repulsing electrode located in the vicinity of the target and which permits a correct current measurement.

For further information regarding these various means it is possible, for example, to refer to the report of J. H. Freeman published in Atom GB 05:8147, Scientific Administration AERE Harwell, Oxfordshire or the article by D. Aitken entitled "The Design Philosophy for a 200 kV Industrial High Current Ion Implanter" published in the Journal "Nuclear Instruments and Methods" 139, 1976, pp. 125-134, or to the work by G. Dearnalay entitled "Ion Implantation", Noth Holland Publishing Company, Amsterdam and London, 1973.

It is simple to check the implanted dose (which is the product of the ion current intensity times the irradiation period) in the case of the two scanning systems, i.e. the purely electrostatic scanning system or the hybrid electrostatic-mechanical scanning system. Due to the large number of passages of the beam on the samples, it is easy to set the end of irradiation which takes place at the end of a short minimum time. Moreover, this large number of passages makes it possible to eliminate the inevitable problems of intensity fluctuations of the beam (breakdowns or the like), the duration of the disturbances produced always being long in comparison with the smallest of the two scanning periods.

However, although these two scanning means are suitable for low or medium currents, they are considered to be unusable in high current implanters. According to the prior art, in the case of high current equipment electrostatic deflection means cannot be used due to the significance then assumed by the space charge phenomenon. Basically this phenomenon is as follows. In an intense ion beam the electrical repulsion forces are such that they tend to blow up the beam. However, this effect is compensated by the presence within the beam of low energy electrons resulting from collisions between ions and neutral atoms of the gas or the bombardment of solid parts of the installation. The ion beam can be completely neutralized by the presence of these electrons provided, however, that possible fluctuations in the intensity of the beam are of low amplitude or frequency.

If an attempt is made to modify the trajectory of a neutralized ion beam by electrostatic means, this simultaneously disturbs the electronic population present in the beam in such a way that the neutralization of the beam is affected. As the beam is no longer completely neutralized difficulties are encountered in its control.

For this reason the prior art has considered that electrostatic scanning systems are unsuitable for high current ion implanters. This was affirmed in particular by D. Aitken in the above-mentioned article and by W. C. Ko in an article entitled "High Current Electric Scanning Method for Ion Beam Writing" published in the Journal IBM Technical Disclosure Bulletin, Vol. 18, No. 6, Nov. 1975, pp. 1832-1835.

Therefore electrostatic and electrostatic-mechanical hybrid scanning systems had to be abandoned in the case of high current implanters and purely mechanical scanning systems had to be developed. They comprise, for example, maintaining fixed the impact zone of the beam and moving the samples in said zone. This movement can be obtained by one or more reels onto which is wound a belt conveyor for the samples. These reels are given a double movement, one comprising rotation about the axis and the other translation parallel to said axis. Combined these two movements give each sample a helical trajectory.

The rotation speed of the reels is for example 80 r.p.m. and the translation of the belt parallel to the axis of the reels is about 1 mm per revolution. If the belt conveyor is 200 mm wide and the impact zone has a height of 50 mm, the total amplitude of lateral displacement of the belt is 250 mm which requires 250 revolutions.

Such purely mechanical scanning systems have many disadvantages:

(1) Due to the low translation speed of the reel the number of revolutions performed by the same must be constituted by whole revolutions and must be predetermined as a function of the intensity of the beam.

(2) As in practice the intensity of the beam undergoes slow fluctuations the latter must be compensated either by making the intensity of the beam dependent on the displacements of the reel or conversely by making said displacements dependent on the intensity. It is obvious that such means are very complex and difficult to design and construct. They may even require the use of a data processor. They are described in the articles by Aitken and Freeman to which reference has been made hereinbefore.

Although the two above-mentioned disadvantages can be overcome, there are others which remain insurmountable:

(3) Since in the case of mechanical scanning the scanning cycles are at least 100 times longer than electrostatic scanning cycles, the condition indicated hereinbefore according to which the duration of the fluctuations must be less than the smallest of the scanning cycles can no longer be met. If it was desired to obviate this disadvantage it would be necessary to use very long implantation periods which would be unacceptable in practice and to reduce the intensity of the ion beam, thereby returning to the field of low current implanters.

(4) The target surface temperature and the partial rearrangement of the crystal lattice thereof are directly linked with the time during which the beam irradiates the same portion of the target. In the case of mechanical scanning this time is long and these problems become insurmountable in the case of certain manufacturing processes.

Magnetic scanning means have been proposed but they suffer from the difficulty of being unable to attain high scanning frequencies.

Thus, in the case of a high current ion implanter it is necessary to use electrostatic scanning in order to obtain a high scanning speed but this implies being able to provide means which are able to surmount the difficulties occurring during the non-neutralisation of the space charge.

With this aim it has been proposed to apply a magnetic field to the electrostatic deflection space, said field being perpendicular to the electrical scanning field and to the beam axis. This field obliges the electrons to oscillate along the axis of the ion beam with the electrical scanning field and to some extent makes it possible to retain the electrons in the beam between the deflecting plates. In this connection reference can be made to the article by W. C. Ko mentioned hereinbefore. However, this solution is onerous and complicated.

BRIEF SUMMARY OF THE INVENTION

The present invention proposes a simpler and less onerous solution which makes it possible to retain the inherent speed of electrostatic scanning while overcoming the difficulties due to the non-neutralisation of the space charge. Thus, the implanter according to the invention obviates the disadvantages mentioned hereinbefore with reference to mechanical scanning apparatus. In particular it makes it possible to work with short irradiation periods which eliminates the problems of the temperature rise on the surface of the target and the rearrangement of the crystal lattice. Thus, the implanter according to the invention is suitable for all manufacturing processes, so that it has great commercial importance.

To this end the invention proposes combining an electrostatic scanning means with a second means suitable for maintaining the focussing of the beam, said second means being of a magnetic type. It comprises for example one or more magnetic quadrupoles or one or more magnetic lenses. This magnetic refocussing means is placed in the vicinity of and preferably upstream from the deflecting plates.

This magnetic means has the advantage of not introducing a space change. Moreover, if it produces overfocussing, i.e. if the magnetic field gradient created by this means is higher than the field gradient necessary for obtaining the focussing of the beam the defocussing effect of the beam due to the space charge is reduced and can be ignored.

Due to this combination of means proposed by the invention the image obtained on the target is smaller, thereby permitting a wider scanning of the target and consequently bringing about a better utilization of the beam.

Therefore the present invention more specifically has for its object a high current ion implanter of the type comprising in a vacuum enclosure an ion source, means for extracting these ions, scanning means and a sample target holder, wherein these scanning means are of the electrostatic type and comprise deflecting plates connected to a variable voltage source and wherein regulatable magnetic refocussing means are located in the vicinity of said plates and preferably upstream thereof.

Preferably the magnetic means provides overfocussing with the advantages inherent therein, as described hereinbefore. However, overfocussing can wholly or partly be obtained by another means comprising one or two lenses located upstream and/or downstream of the deflecting plates. When these plates are brought to an alternatively positive and negative potential compared with a reference potential which is that of the implanter earth, the lenses in question can be brought to said earth potential.

Preferably each lens comprises two guard rings connected to earth between which is disposed a cylinder which can be brought to an appropriate potential.

These lenses contribute to the refocussing of the beam and consequently help to limit the spread of the latter under space charge action. These lenses have the advantage of being positionable in the immediate vicinity of the deflecting plates, which is not the case with magnetic quadrupoles which have larger overall dimensions and which are therefore positioned farther from the deflection zone.

The electrostatic scanning means used in the present invention is either of the purely electrostatic type (XY scanning with two sets of deflecting plates) or of the hybrid electrostatic-mechanical type.

In certain constructional variants and in order to eliminate neutrals a permanent deflection can be ensured by deflecting plates to which a direct current voltage is applied and is superimposed on the sawtooth voltage necessary for scanning purposes. The implanter may comprise, in addition to the means described hereinbefore, an additional accelerating tube positioned behind the ion source, whereby said tube may optionally be provided with a downstream electron suppressor, an ion analyzer with optionally a post-accelerating tube positioned behind the analyzer and whereby the latter is equipped with an electron-repulsing electrode for limiting the production of X-rays.

Finally it is possible within the scope of the invention to use means which permit, according to the prior art, the application of a magnetic field perpendicular to the axis of the beam and to the electrical deflecting field with the aim of reducing still further the non-neutralization of the space charge. Although the prior art means were relatively unsatisfactory when required alone to reduce the non-neutralization of the space charge, this does not apply when there are used in addition to the means according to the invention. The magnetic field to be applied is then less intense than in the prior art, which reduces costs and also the overall dimensions of the means to be used.

BRIEF DESCRIPTION OF THE DRAWINGS

The features and advantages of the invention will become more apparent from the following description of non-limitative embodiments and with reference to the attached drawings, wherein show.

DETAILED DESCRIPTION OF THE PREFERRED EMBODIMENTS

Figure 1:
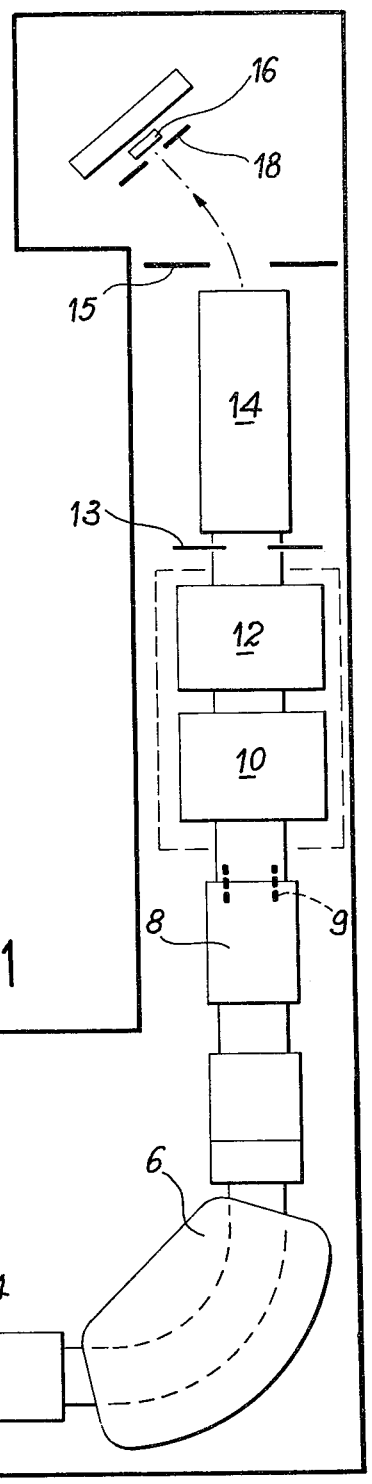
FIG. 1 a general diagram of a high current ion implanter according to the invention.

The ion implanter shown in FIG. 1 successively comprises an ion source 2, extracting and pre-accelerating means 4, a magnetic mass analyzer 6, a post-accelerating tube 8, optionally an electron-suppressing electrode 9, then according to the invention two magnetic quadrupole lenses 10 and 12 followed by an electrostatic deflecting system 14 inserted between two lenses 13 and 15 and finally in a per se known manner a sample-carrying target 16 in the vicinity of which is positioned an electron-repulsing electrode 18. The installation is under high vacuum as a result of pumps, only one of which is shown and is given reference numeral 20.

As indicated hereinbefore all the means shown in FIG. 1 need not necessarily be used together, the essential point according to the invention being that the magnetic refocussing means 10/12 are disposed in the vicinity (in this case upstream) of the electrostatic scanning means 14.

Figure 2:
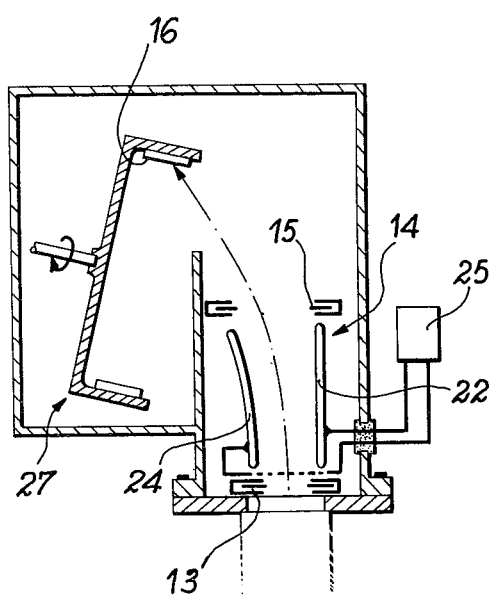
FIG. 2 a variant in which hybrid electrostatic-mechanical scanning is used.

According to an advantageous embodiment illustrated in FIG. 2 the scanning means 14 are of the hybrid electrostatic-mechanical type. It comprises a set of plates 22, 24 connected to a periodic power source 25 and a mechanical means 27 able to move the target 16 in a direction perpendicular to the electrostatic deflection direction.

The scanning voltage can vary in sawtooth manner and can be, for example, of the order of 7 kV peak to peak, modulated at 1,000 Hz, the linearity defect of the sawteeth being as small as possible and for example below 1%. This voltage may be distributed on either side of the earth potential of the apparatus. However, the voltage may also vary in triangular manner and have a positive or zero mean value.

Although numerous means can be used for realizing the mechanical part of the scanning, the use of a lens barrel whose axis is substantially perpendicular to the deflecting plates would appear to be advantageous. It makes it possible to place the samples on the inner wall of the barrel in such a way that they are firmly engaged with the latter during the rotation of the assembly. The linear velocity of the barrel can be of the order of a few hundred meters per minute. In connection with said special means reference can be made to Swiss patent application No. 016 342 76, filed on Dec. 27th 1976 by BALZERS.

Figure 3:
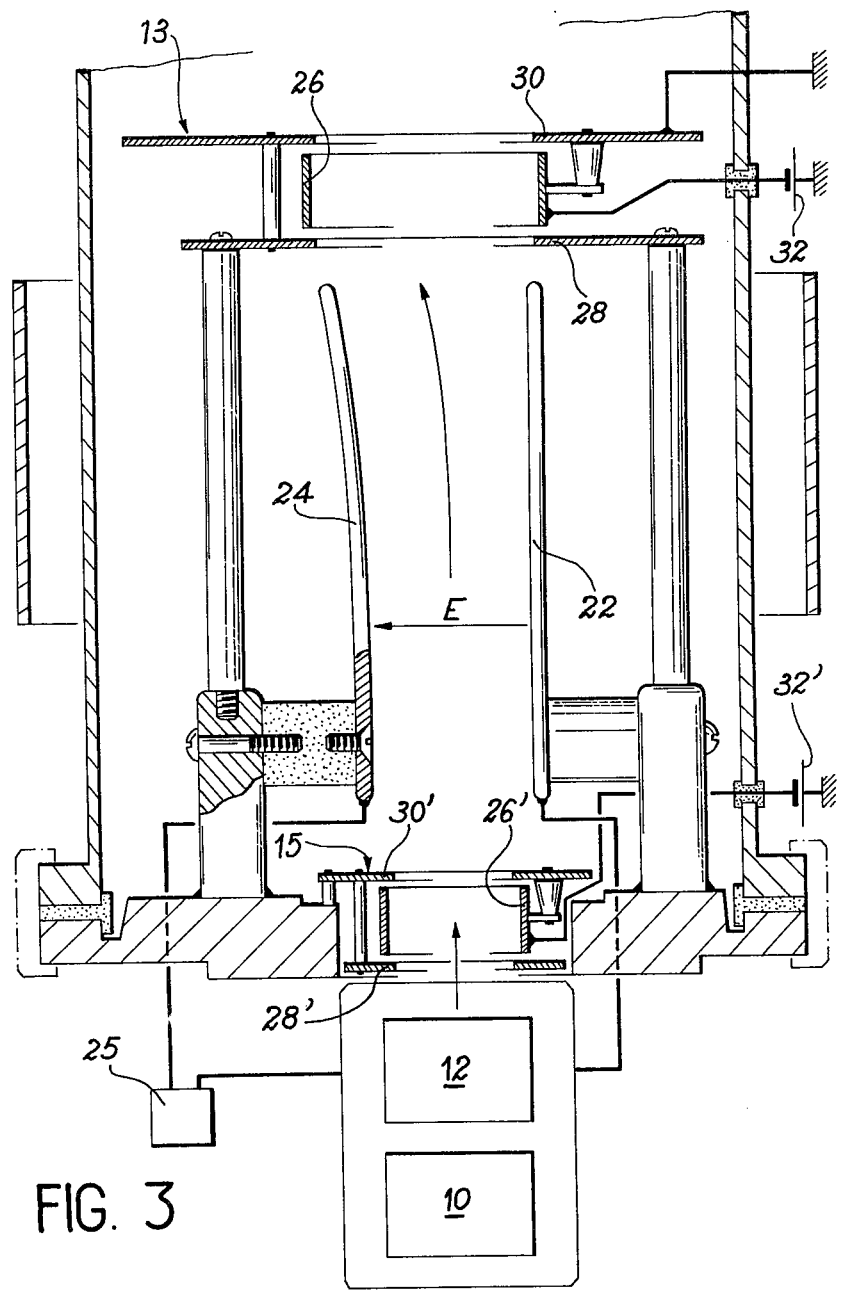
FIG. 3 in more specific manner the deflecting plate system combined with two magnetic quadrupoles.

FIG. 3 illustrates an embodiment of the means according to the invention in which each lens comprises an electrode 26 (26') inserted between two guard rings 28, 30 (28', 30'). The electrode 26 (26') is connected to the apparatus earth or to the negative or positive pole of a power source 32 (32') and the rings are optionally connected to earth. The voltage supplied by the sources 32 and 32' is for example approximately 300 V, but may reach several kilovolts.

The guard rings may extend up to the vicinity of the external enclosure of the apparatus, as illustrated in FIG. 3 by the downstream barrier.

When the lenses are connected to apparatus earth the voltage applied to plates 22 and 24 may vary on either side of earth. In the case of a peak to peak voltage of 7 kV this voltage may vary from +3.5 kV to −3.5 kV.

The magnetic quadrupoles 10 and 12 may be of any known type. They comprise pole pieces 34 (36) supplied with magnetic flux by windings 38 (40) connected to a regulatable double power source 42.

As a non-limitative example magnetic quadrupoles with the following characteristics have been successfully used:

| length of poles: | 225 mm |
| diameter of circle inscribed within the poles: | 90 mm |
| magnetic field gradient: | 6 Testas/m. |

In the case of an implanter using arsenic ions and working at a voltage of 40 kV the magnetic field gradient may be substantially doubled on passing from a current of 100 μA to a current of 2 mA.

The following procedure may advantageously be used to regulate the overfocussing of the ion beam. In a first variant the scanning means are put into operation and the refocussing means is regulated to obtain an ion beam focussed on the target. In a second variant the scanning means are not rendered operational and the refocussing means is regulated to obtain an ion beam focussed in front of the target. In both cases the space charge effect is compensated by overfocussing.

What is claimed is:

1. A high current ion implanter of the type comprising in a vacuum enclosure an ion source, means for extracting these ions, scanning means and a sample-carrying target, wherein the scanning means are of the electrostatic type and comprise deflecting plates connected to a variable voltage source and wherein magnetic refocussing means provided with a regulatable source of energizing current therefor is disposed in the vicinity of said plates.

2. An ion implanter according to claim 1, wherein the refocussing means is disposed upstream of the deflecting plates.

3. An ion implanter according to claim 1, wherein the magnetic refocussing means comprises at least one magnetic quadrupole or at least one magnetic lens.

4. An ion implanter according to claim 1, wherein the magnetic means has overfocussing characteristics.

5. An ion implanter according to claim 1, which also comprises at least one lens positioned upstream and/or downstream of the deflecting plates for auxiliary focussing of the beam.

6. An ion implanter according to claim 5, wherein each lens for auxiliary focussing is connected to a guard ring.

7. An ion implanter according to claim 5, wherein each lens for auxiliary focussing is an electrostatic lens and comprises two guard rings connected to earth between which is located the lens electrode.

8. An ion implanter according to claim 7, wherein the electrode of a lens is connected to the apparatus earth.

9. An ion implanter according to claim 1, wherein the deflecting plates are brought to a potential which is alternately positive and negative relative to the apparatus earth, the mean value of the potential being positive.

10. An ion implanter according to claim 9, wherein the potential applied to the deflecting plates has a triangular variation.

11. A method for regulating the dimensions of an ion beam in a high current ion implanter relative to a target, said implanter comprising an electrostatic scanning means and a regulatable magnetic refocussing means, wherein the focussing means are regulated while the scanning means are not in operation to obtain an ion beam focussed in front of the target, whereby when the scanning means are thereafter put into operation an ion beam focussed on the target is obtained.

* * * * *